US009349829B2

United States Patent
Ostermaier et al.

(10) Patent No.: US 9,349,829 B2
(45) Date of Patent: May 24, 2016

(54) METHOD OF MANUFACTURING A MULTI-CHANNEL HEMT

(71) Applicant: Infineon Technologies Austria AG, Villach (AT)

(72) Inventors: Clemens Ostermaier, Villach (AT); Gerhard Prechtl, St. Jakob i. Rosental (AT); Oliver Haeberlen, Villach (AT); Hans Peter Felsl, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/689,578

(22) Filed: Apr. 17, 2015

(65) Prior Publication Data

US 2015/0221748 A1     Aug. 6, 2015

Related U.S. Application Data

(62) Division of application No. 13/525,745, filed on Jun. 18, 2012, now Pat. No. 9,035,355.

(51) Int. Cl.
| | |
|---|---|
| *H01L 21/336* | (2006.01) |
| *H01L 21/338* | (2006.01) |
| *H01L 29/778* | (2006.01) |
| *H01L 29/66* | (2006.01) |
| *H01L 29/40* | (2006.01) |
| *H01L 29/417* | (2006.01) |
| *H01L 29/423* | (2006.01) |
| *H01L 29/20* | (2006.01) |
| *H01L 21/02* | (2006.01) |
| *H01L 21/306* | (2006.01) |
| *H01L 29/15* | (2006.01) |

(52) U.S. Cl.
CPC ...... *H01L 29/66462* (2013.01); *H01L 21/0254* (2013.01); *H01L 21/30604* (2013.01); *H01L 29/2003* (2013.01); *H01L 29/407* (2013.01); *H01L 29/41725* (2013.01); *H01L 29/4236* (2013.01); *H01L 29/778* (2013.01); *H01L 29/7783* (2013.01); *H01L 29/155* (2013.01); *H01L 29/41766* (2013.01); *H01L 29/42368* (2013.01)

(58) Field of Classification Search
CPC ............. H01L 29/66462; H01L 29/7787; H01L 29/66431; H01L 29/7786
USPC .......................................... 257/194; 438/172
See application file for complete search history.

(56) References Cited

U.S. PATENT DOCUMENTS

| | | | | |
|---|---|---|---|---|
| 5,610,085 | A | * | 3/1997 | Yuan et al. ............... 438/187 |
| 2005/0285098 | A1 | * | 12/2005 | Fathimulla et al. ........... 257/20 |
| 2006/0118862 | A1 | * | 6/2006 | Hirler et al. ................ 257/330 |

(Continued)

*Primary Examiner* — Andy Huynh
*Assistant Examiner* — Sitaramarao S Yechuri
(74) *Attorney, Agent, or Firm* — Murphy, Bilak & Homiller, PLLC

(57) ABSTRACT

A method of manufacturing a transistor device includes forming a semiconductor heterostructure including a plurality of alternating two-dimensional electron gasses (2DEGs) and two-dimensional hole gasses (2DHGs) extending in parallel at different depths in the semiconductor heterostructure, the 2DEGs forming current channels of the transistor device, forming a source extending into the semiconductor heterostructure in contact with the 2DEGs at a first end of the current channels, forming a drain extending into the semiconductor heterostructure in contact with the 2DEGs at an opposing second end of the current channels, and forming a plurality of spaced apart gate structures extending into the semiconductor heterostructure and including an electrically conductive material separated from the surrounding semiconductor heterostructure by an insulating material.

8 Claims, 15 Drawing Sheets

(56) References Cited

U.S. PATENT DOCUMENTS

2008/0087956 A1* 4/2008 Blanchard .................... 257/335
2009/0267078 A1* 10/2009 Mishra et al. .................. 257/76
2010/0320505 A1* 12/2010 Okamoto et al. ............. 257/192
2011/0215378 A1* 9/2011 Hwang et al. ................. 257/194

* cited by examiner

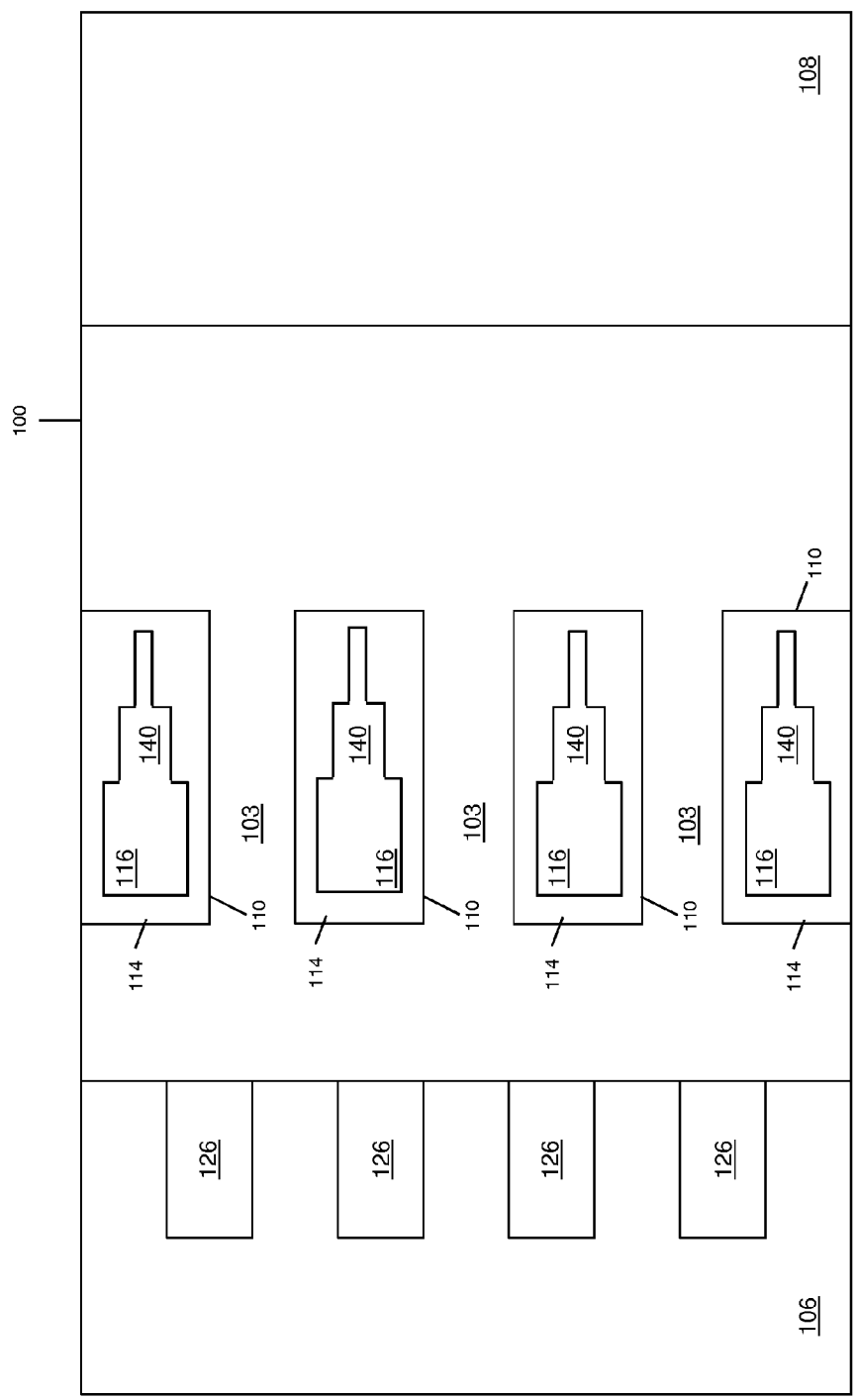

US 9,349,829 B2

METHOD OF MANUFACTURING A MULTI-CHANNEL HEMT

TECHNICAL FIELD

The instant application relates to high electron mobility transistors (HEMTs), and more particularly to HEMTs having low on-state resistance.

BACKGROUND

Power HEMTs (high electron mobility transistors) and other types of heterostructure devices preferably have a low RON*A (specific on-resistance metric, where A corresponds to area) to ensure efficient operation. However, conventional techniques for lowering RON*A in heterostructure devices such as HEMTs typically reduce breakdown voltage which is undesirable for many applications.

SUMMARY

The embodiments described herein reduce RON*A (specific on-resistance, where A corresponds to area) for heterostructure devices such as HEMTs while having a minimal impact on breakdown voltage, by providing parallel 2DEG (two-dimensional electron gas) channels at different depths of the heterostructure. The parallel 2DEG channels result in a multi-channel device. The additional channels are provided without using surface charges. Instead, 2DHGs (two-dimensional hole gases) are interleaved between the 2DEG channels at different depths in the heterostructure. The 2DHGs compensate the channel charges rather than surface charges.

According to an embodiment of a transistor device, the transistor device comprises a semiconductor heterostructure including a plurality of alternating two-dimensional electron gasses (2DEGs) and two-dimensional hole gasses (2DHGs) extending in parallel at different depths in the semiconductor heterostructure. The 2DEGs form current channels of the transistor device. The transistor device further comprises a source extending into the semiconductor heterostructure in contact with the 2DEGs at a first end of the current channels, and a drain extending into the semiconductor heterostructure in contact with the 2DEGs at an opposing second end of the current channels. The transistor device also includes a plurality of spaced apart gate structures extending into the semiconductor heterostructure. The gate structures comprise an electrically conductive material separated from the surrounding semiconductor heterostructure by an insulating material.

According to an embodiment of a semiconductor device, the semiconductor device comprises a semiconductor heterostructure including a plurality of alternating two-dimensional electron gasses (2DEGs) and two-dimensional hole gasses (2DHGs) extending in parallel at different depths in the semiconductor heterostructure. The semiconductor device further comprises a first doped region disposed in the semiconductor heterostructure in contact with the 2DEGs, and a second doped region spaced apart from the first doped region in the semiconductor heterostructure and in contact with the 2DEGs. The semiconductor device also comprises a plurality of spaced trench structures extending into the semiconductor heterostructure so that regions of the heterostructure are disposed between adjacent ones of the trench structures. Each trench structure comprises an insulating material lining sidewalls and a bottom of the trench structure and an electrically conductive material separated from the surrounding semiconductor heterostructure by the insulating material.

According to an embodiment of a method of manufacturing a transistor device, the method comprises: forming a semiconductor heterostructure including a plurality of alternating two-dimensional electron gasses (2DEGs) and two-dimensional hole gasses (2DHGs) extending in parallel at different depths in the semiconductor heterostructure, the 2DEGs forming current channels of the transistor device; forming a source extending into the semiconductor heterostructure in contact with the 2DEGs at a first end of the current channels; forming a drain extending into the semiconductor heterostructure in contact with the 2DEGs at an opposing second end of the current channels; and forming a plurality of spaced apart gate structures extending into the semiconductor heterostructure and comprising an electrically conductive material separated from the surrounding semiconductor heterostructure by an insulating material.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIG. 10 illustrates a top-down plan view of a semiconductor device with a field plate according to yet another embodiment.

DETAILED DESCRIPTION

Figure 1:
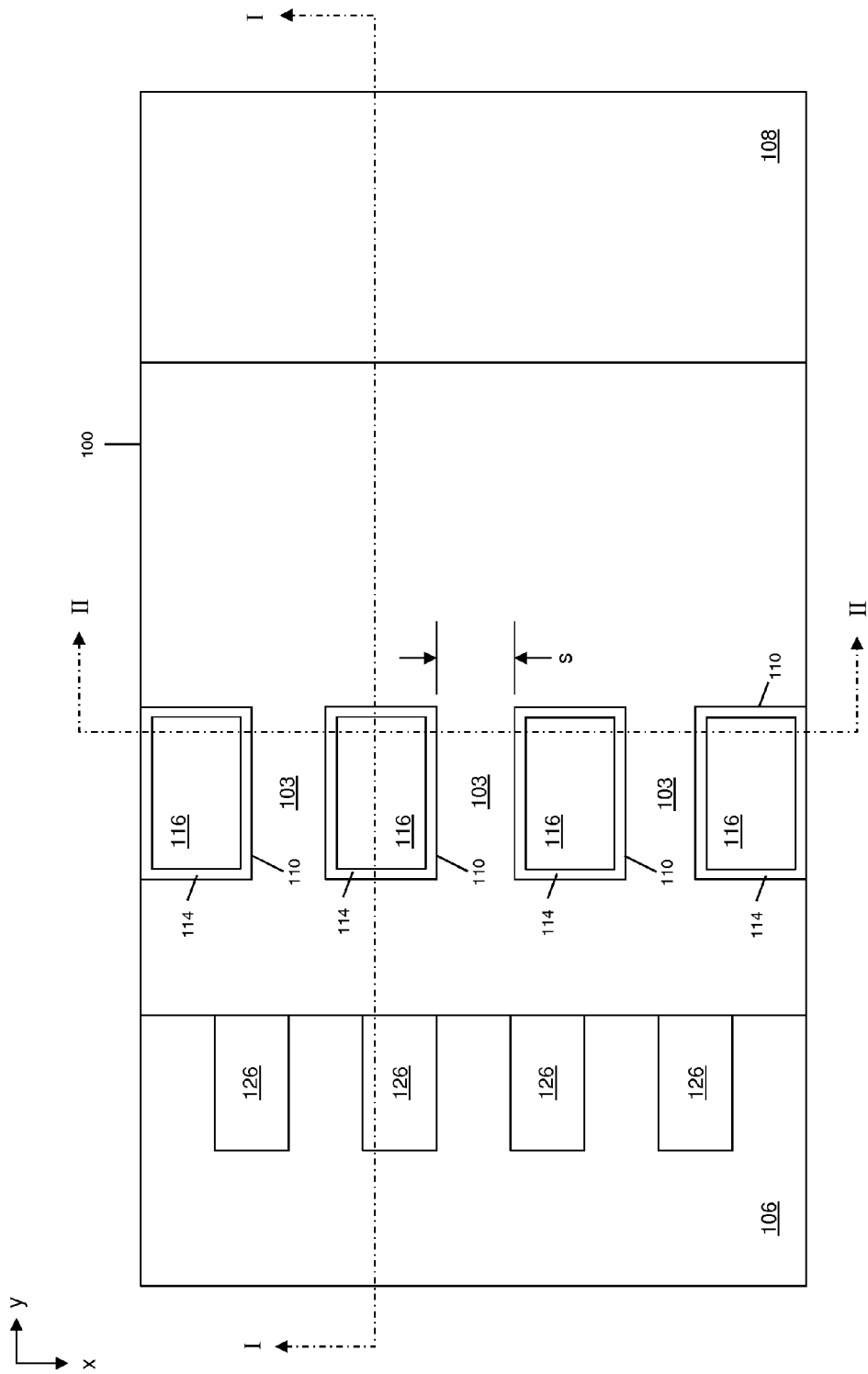
FIG. 1 illustrates a top-down plan view of a semiconductor device according to an embodiment.
Figure 2:
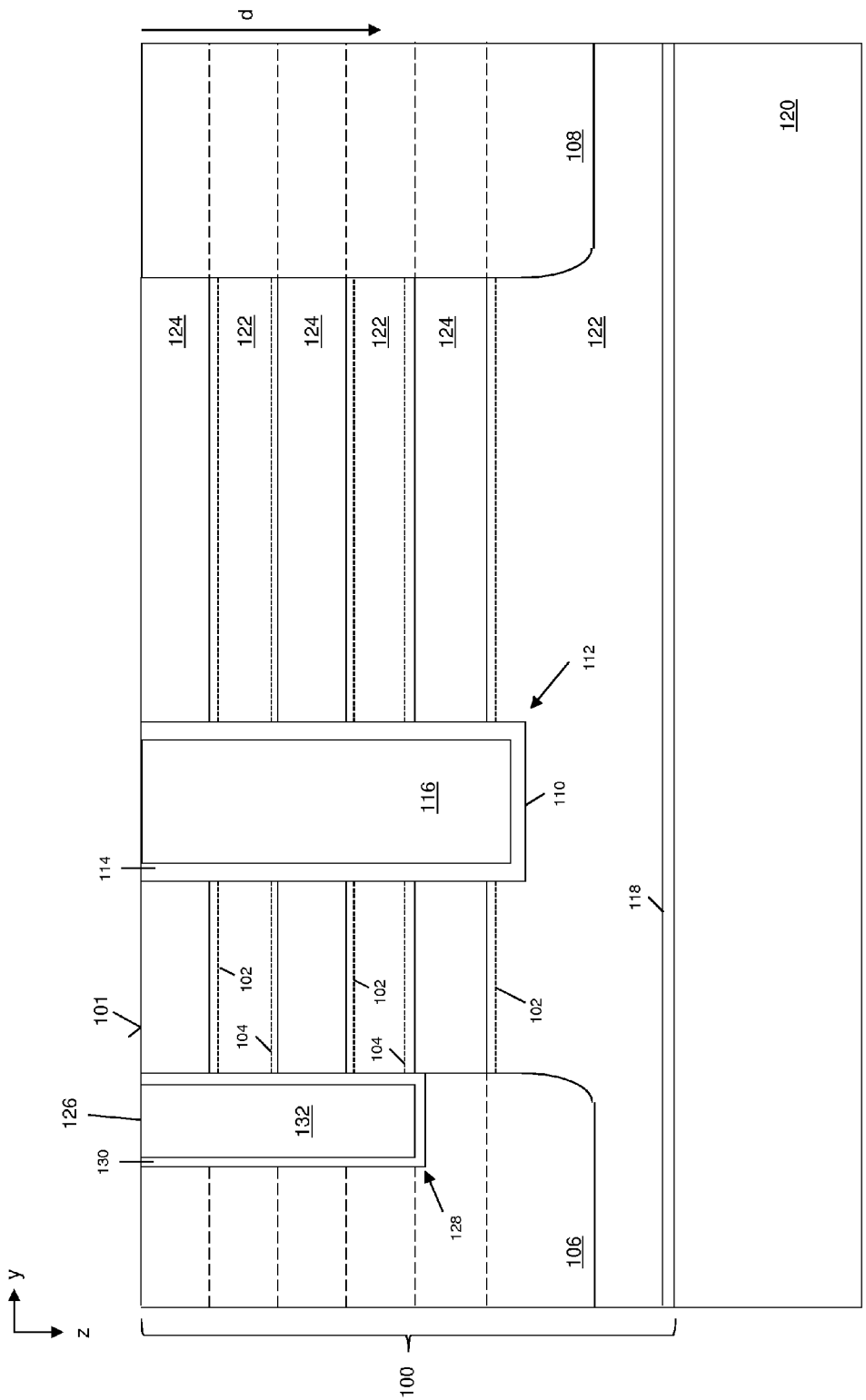
FIGS. 2 and 3 illustrate different cross-sectional views of the semiconductor device of FIG. 1.
Figure 3:
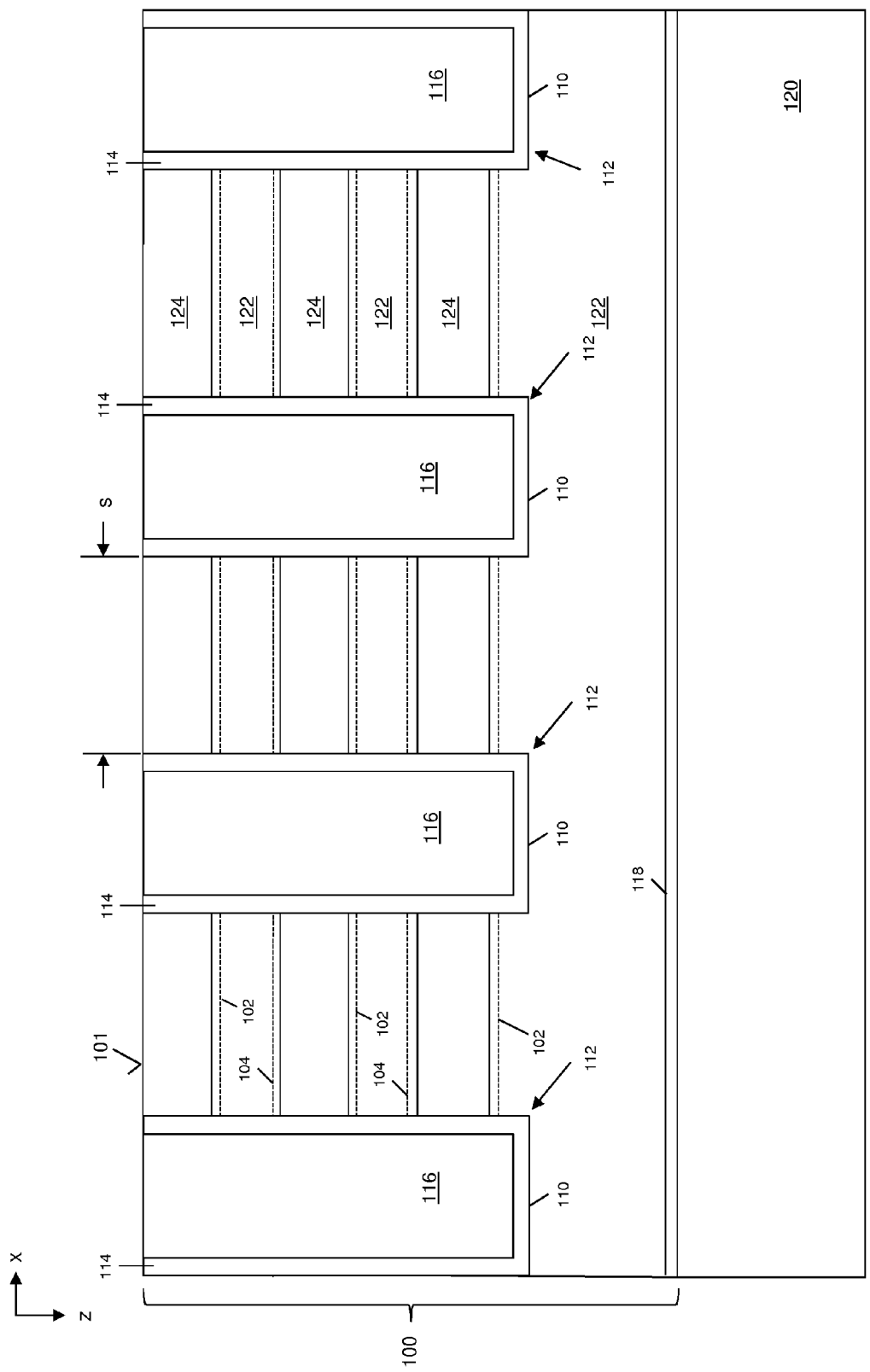

FIG. 1 illustrates a top-down plan view of an embodiment of a semiconductor device. FIG. 2 illustrates a first cross-sectional view of the semiconductor device along the line labeled I-I in FIG. 1, and FIG. 3 illustrates a second cross-sectional view of the device along the line labeled II-II in FIG. 1. The device includes a semiconductor heterostructure 100 having a plurality of alternating two-dimensional electron gasses (2DEGs) 102 and two-dimensional hole gasses (2DHGs) 104 extending in parallel in the semiconductor heterostructure 100 at different depths (d) from a first (top) 101 surface of the heterostructure 100 (direction 'z' in FIGS. 2 and 3). The 2DEGs 102 provide multiple channels for the semiconductor device to conduct carriers, resulting in a multi-channel device. The additional channels are buried in the heterostructure 100 below the uppermost 2DEG channel 102 and arise without using surface charges. Instead, the 2DHGs 104 are interleaved between the 2DEG channels 102 to compensate the channel charges rather than surface charges for all but the uppermost 2DEG channel 102. An optional thick GaN layer can be provided as the uppermost layer of the heterostructure 100 so that the surface charges do not compensate even the uppermost 2DEG channel 102.

In either case, the heterostructure 100 is formed such that positive and negative polarization charges are built up at different depths in the heterostructure 100 to form the 2DEGs 102 and 2DHGs 104 and minimize the electric energy, once the potential caused by the polarization exceeds the bandgap. For example, the heterostructure 100 can include GaN/AlGaN/GaN or GaN/InAlN/GaN structures which cause the positive and negative polarization charges to build up at different depths in the heterostructure 100 to form the 2DEGs 102 and 2DHGs 104.

In the on-state, current flows from a first doped region 106 disposed in the semiconductor heterostructure 100 in contact with the 2DEGs 102 at one end of the current channels to a spaced apart second doped region 108 in contact with the 2DEGs 102 at the other end of the current channels (direction 'y' in FIGS. 1 and 2). For a transistor device such as an HEMT, the first doped region 106 is an n+ source and the second doped region 108 is an n+ drain. The current channels, formed by the multiple 2DEGs 102, are partly obstructed by trench structures 110 which are spaced apart in the semiconductor heterostructure 100 in a direction perpendicular (direction 'x' in FIGS. 1 and 3) to the current flow direction (direction 'y' in FIGS. 1 and 2).

The trench structures 110 comprise a trench 112 formed in the semiconductor heterostructure 100 and an insulating material 114 lining sidewalls and a bottom of each trench 112. In one embodiment, the insulating material 114 comprises aluminum oxide, silicon oxide, hafnium oxide or silicon nitride. The trench structures 110 further comprise an electrically conductive material 116 separated from the surrounding semiconductor heterostructure 100 by the insulating material 114. In one embodiment, the electrically conductive material 116 comprises polysilicon or a metal. For transistor devices, the trench structures 110 are gate structures, the insulating material 114 is a gate dielectric and the conductive filler material 116 is the gate.

Providing the trench structures 110 spaced apart in the semiconductor heterostructure 100 in a direction perpendicular to the current flow direction yields regions 103 of the heterostructure 100 disposed between adjacent ones of the trench structures 110 as shown in FIGS. 1 and 3. Current flows around and between the trench structures 110 through the regions 103 of the heterostructure 100 disposed between adjacent ones of the trench structures 110 via the 2DEG channels 102 when the device is biased in an on-state. For a transistor device such as an HEMT, the current flow direction is between the source 106 and drain 108 of the transistor (direction 'y' in FIGS. 1 and 2).

Appropriately biases the trench structures 110 can deplete the 2DEG channels 102 in the regions 103 of the heterostructure 100 disposed between adjacent ones of the trench structures 100 and therefore control the amount of current flowing in the device. The regions 103 of the heterostructure 100 disposed between the trench structures 110 mainly define the threshold voltage of the device. The trench structures 110 can deplete the 2DEG channels 102 from the sides according to the embodiments shown in FIGS. 1-3 when a sufficient bias is applied to the conductive filler material 116 of the trench structures. According to the embodiment illustrated in FIGS. 1-3, each gate structure 110 can be individually biased if desired. As such, the electrically conductive material 116 of one trench structure 110 can be biased differently than the electrically conductive material 116 of an adjacent trench structure 110 and the threshold voltage can be set within the limits given by the insulating material 114 of the trench structure 110.

Figure 4:
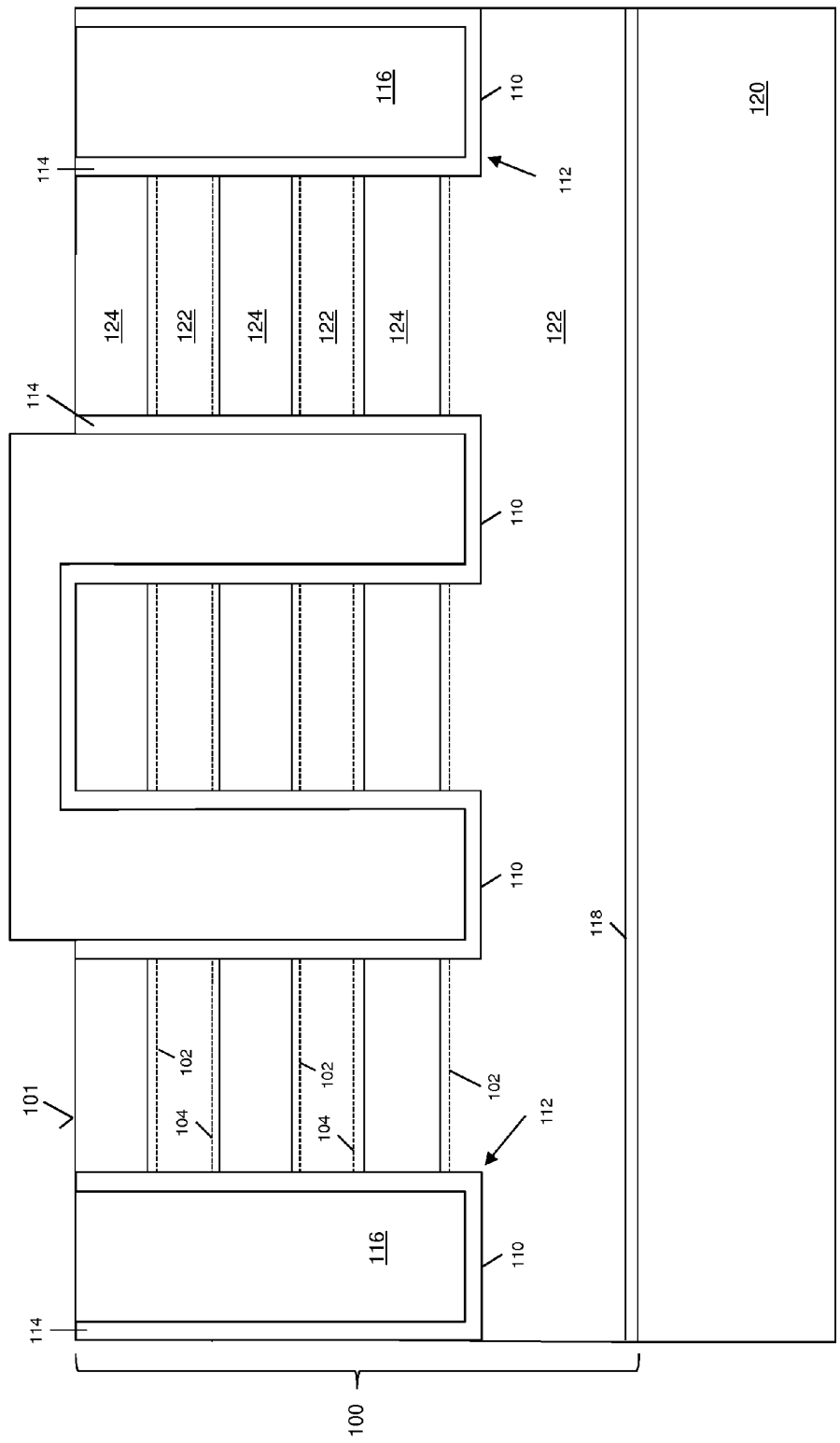
FIG. 4 illustrates a cross-sectional view of a semiconductor device according to another embodiment.

FIG. 4 shows another embodiment where the insulating material 114 and the electrically conductive material 116 of one trench structure 110 extends onto the first (top) surface 101 of the semiconductor heterostructure 100 and into an adjacent trench structure 110 so that the adjacent trench structures 110 share the same contiguous insulating material 114 and the same contiguous electrically conductive material 116. According to this embodiment, at least the uppermost 2DEG channel 102 is depleted from the first (top) surface 101 of the heterostructure 100 by surface charges.

In each case, the vertically offset 2DEGs 102 provide multiple parallel channels for current to flow at different depths in the semiconductor heterostructure 100. The interleaved 2DHGs 104 compensate the channel charges, and the trench structures 110 can deplete the 2DEG channels 102 in the regions 103 of the heterostructure 100 disposed between the trench structures 110 when biased sufficiently so that no current (or substantially no current) flows between the two doped regions 106, 108 of the device. Otherwise, the device is normally on. The threshold voltage of the device depends on the semiconductor heterostructure technology employed, the spacing (s) between adjacent trench structures 110 and the gate oxide thickness. For example with GaN technology, the spacing between adjacent trench structures 110 can range from 200 nm to 500 nm in a direction (direction 'x' in FIGS. 1 and 3) perpendicular to the current flow direction (direction 'y' in FIGS. 1 and 2). Such trench structure spacing results in a threshold voltage in the range of −2.5 V to −9.5 V for a 20 nm thick AlGaN barrier layer with 25% Al content and 20 nm thick insulating material 114 lining the bottom and sidewalls of the trench structures 110.

According to one embodiment, the semiconductor heterostructure 100 includes a nucleation layer 118 on a substrate 120 and on the nucleation layer 118 alternating layers 122, 124 of GaN and a GaN alloy. One or more of the GaN alloy barrier layers 124 can have at least one of a different Al content and thickness than other ones of the GaN alloy barrier layers 124 according to an embodiment, altering the depletion of the 2DEG channel in each adjacent GaN buffer layer 122. The GaN alloy can be any suitable GaN alloy such as AlGaN, InAlN, AlN or InAlGaN. Each GaN buffer layer 122 interposed between underlying and overlying ones of the GaN alloy barrier layers 124 has a 2DEG 102 near the interface with the overlying GaN alloy barrier layer 124 and a 2DHG 104 near the interface with the underlying GaN alloy barrier layer 124. In one embodiment, the trench structures 110 extend into the semiconductor heterostructure 100 to the lowermost GaN layer 122 e.g. as shown in FIGS. 2-4. A GaN cap layer, which is not shown in FIGS. 2-4, can be provided on the uppermost GaN alloy barrier layer 124 if desired.

The 2DEG concentration depends on the Al content of the GaN alloy barrier layers 124 and the thickness of the GaN/GaN alloy layers 122, 124. For GaN/AlGaN/GaN structures, a rough estimation of the 2DEG concentration is given by:

$$q \cdot n_{2DEG} = q \cdot n_{2DHG} = \frac{q \cdot n_{pol}}{\varepsilon} - \frac{E_G}{d} \quad (1)$$

where q is the elementary charge, $n_{pol}$ is the polarization charge density reflecting the difference in the polarization at the AlGaN/GaN interfaces, $E_G$ is the GaN bandgap and d is the layer thickness. Equation (1) is valid for positive values and for a layer thickness (d) greater than the critical thickness required to form a channel.

If for example AlGaN barrier layers are used in the heterostructure 100, a technological limit is given by the maximum layer thickness of each single layer AlGaN barrier layer. This critical thickness, which decreases with increasing Al content, is however above the minimal thickness to form a two-dimensional carrier gas. Alternatively, different material systems such as lattice-matched InAlN can be considered which also offer a higher polarization charge than conventional AlGaN barriers.

In general with GaN technology, polar or semi-polar planes (i.e. R-plane) can be used in fabricating the GaN-based structures described herein e.g. GaN/AlGaN/GaN or GaN/InAlN/GaN heterostructures. Also with GaN technology, the presence of polarization charges and strain effects result in the realization of 2DEGs 102 and 2DHGs 104 characterized by very high carrier density and carrier mobility. The parallel 2DEGs 102 form the conductive channels of the semiconductor device and the interleaved 2DHGs 104 compensate the channel charges. Other compound semiconductor technologies which have 2DEGs and 2DHGs can also be used. In each case, polarization charges are used to form the parallel 2DEG channels 102 at different depths in the semiconductor heterostructure 100 and the interleaved 2DHGs 104 for compensating the channel charges. Other combinations of III-V semiconductor materials can be used in order to form the 2DEGs 102 and 2DHGs 104 as is well known in the art.

The semiconductor device also comprises spaced apart contacts 126 extending into the semiconductor heterostructure 100 in contact with the 2DHGs 104, providing a parallel connection to the 2DHGs 104 which is beneficial for the depletion of the device. In one embodiment, the contacts 126 are disposed in trenches 128 formed in the heterostructure 100. Each trench 128 has a bottom and sidewalls. The bottom and sidewalls can be covered by a first metal 130 e.g. such as NiAu and the trenches 128 can be filled by a second metal 132 different than the first metal 128 such as Al or an Al alloy as shown in FIG. 2. Other contact structures can be used such as spaced apart p+ doped regions. The contacts 126 extend into the first (source) doped region 106 in FIGS. 1 and 2, and are spaced apart in the heterostructure 100 in a direction perpendicular (direction 'x' in FIGS. 1 and 3) to the current flow direction (direction 'y' in FIGS. 1 and 2).

Figure 5:
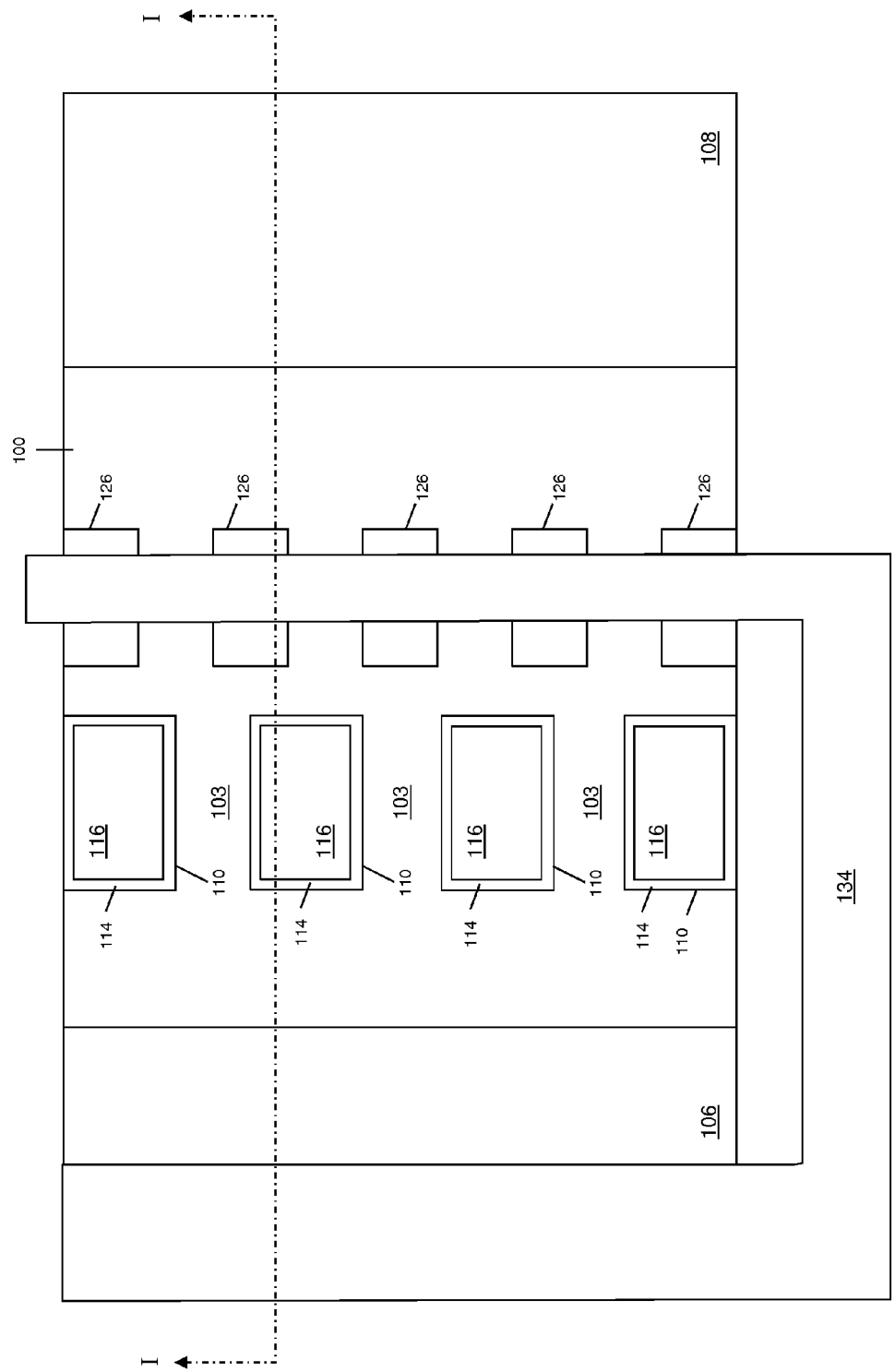
FIG. 5 illustrates a top-down plan view of a semiconductor device according to yet another embodiment.
Figure 6:
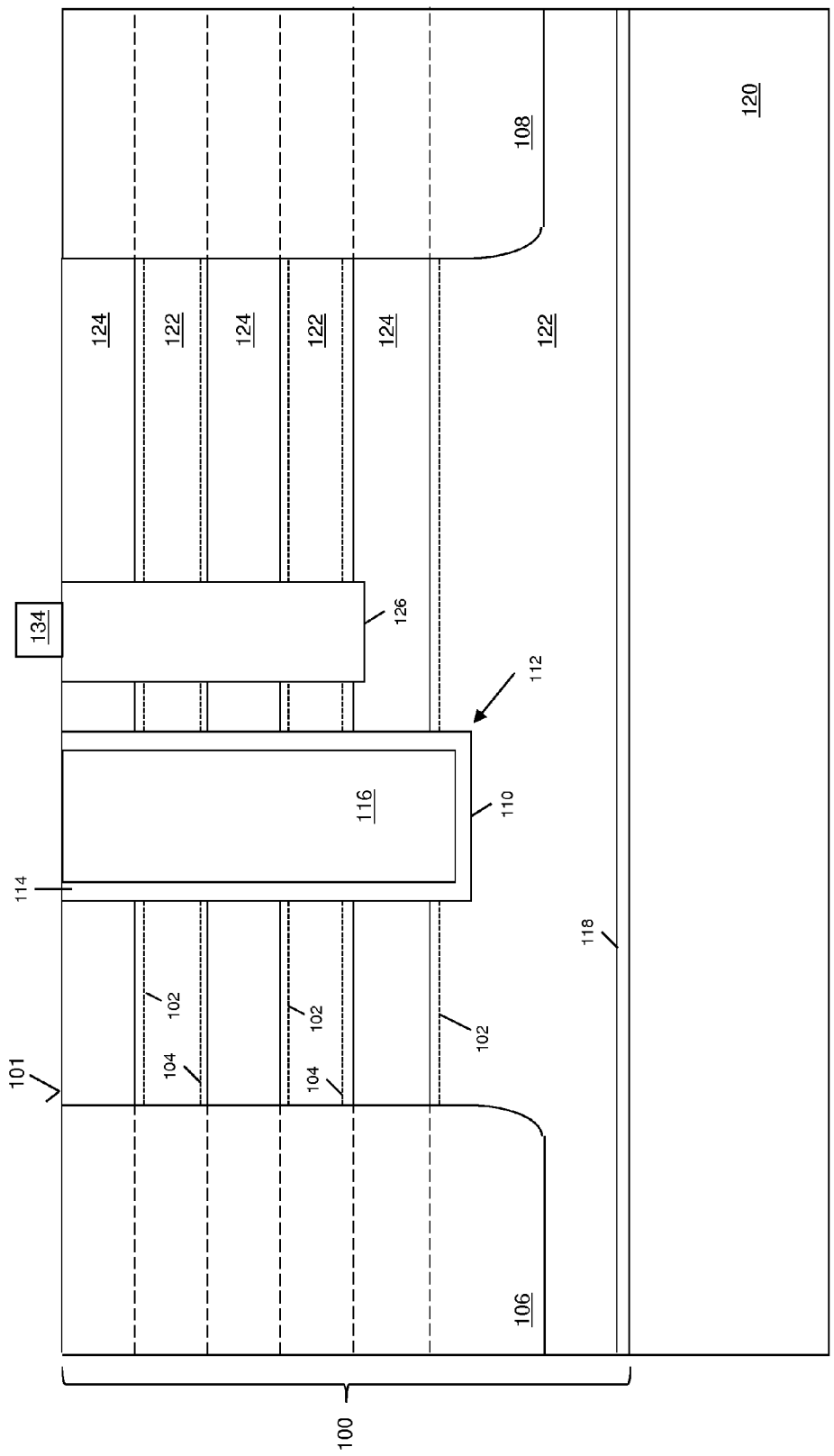
FIG. 6 illustrates a cross-sectional view of the semiconductor device of FIG. 5.

FIG. 5 illustrates a top-down plan view of an alternative embodiment of the semiconductor device where the 2DHG contacts 126 are disposed in the semiconductor heterostructure 100 between the gate structures 110 and the second (drain) doped region 108. For example, the 2DHG contacts 126 can be disposed in the drift region of the transistor. FIG. 6 illustrates a cross-sectional view of the device along the line labeled I-I in FIG. 5. According to the embodiment shown in FIGS. 5 and 6, holes from the drift region are easily extracted as opposed to accumulating near the gate and having to overcome the gate-to-source potential in order to be removed.

In each embodiment, the 2DHG contacts 126 can be electrically connected to a source potential or a gate potential of the transistor device. According to the embodiment illustrated in FIGS. 1 and 2, the 2DHG contacts 126 are in direct contact with the source 106 of the transistor device. According to the embodiment illustrated in FIGS. 5 and 6, a source electrode 134 is connected to the source 106 of the transistor device and to the 2DHG contacts 126 which are disposed in the drift region of the transistor device between the gate structures 110 and the drain 108.

Figure 7A:
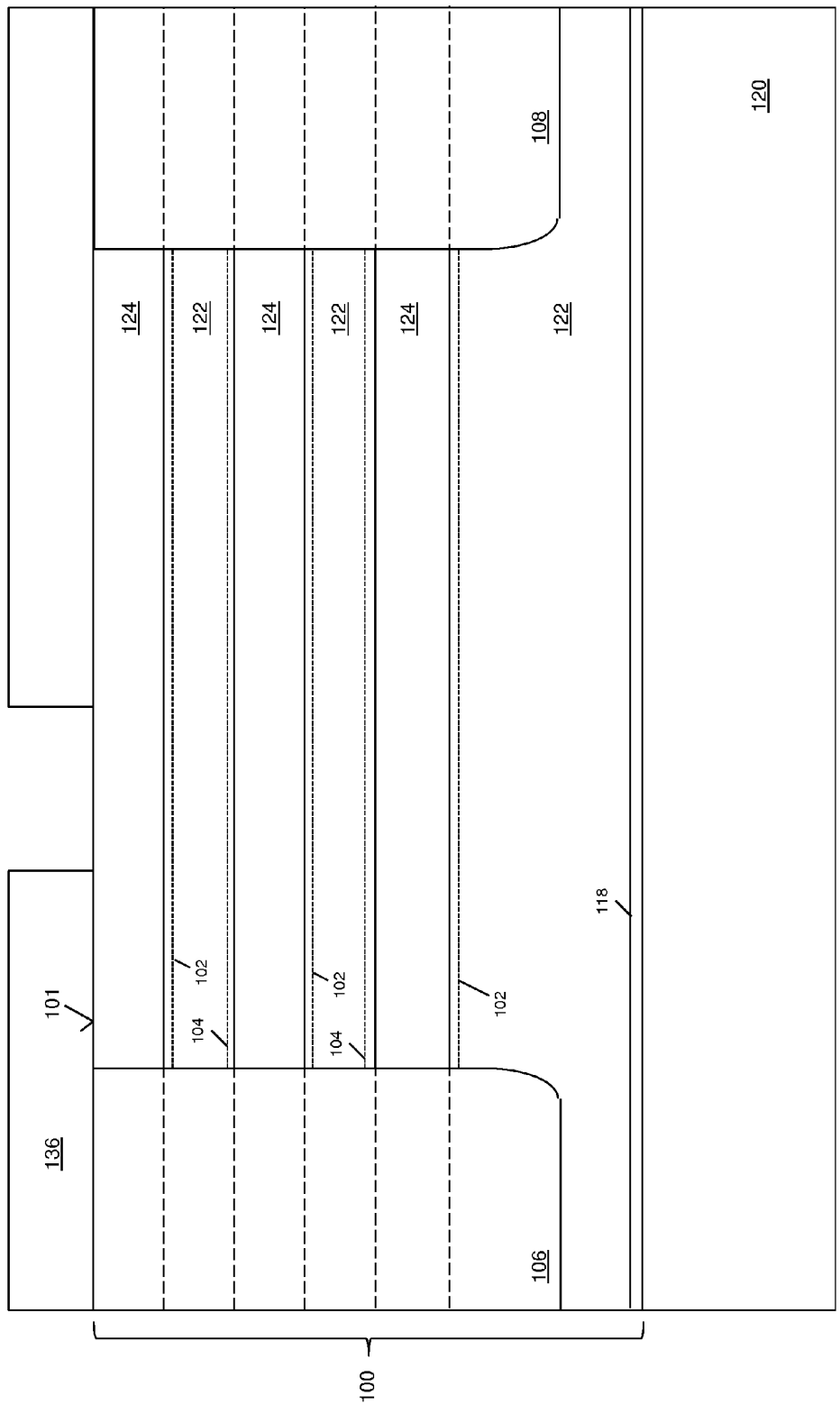
FIGS. 7A through 7F illustrate cross-sectional views of a semiconductor device during different stages of a method of manufacturing the device.

FIGS. 7A through 7F illustrate cross-sectional views of the semiconductor device during different stages of manufacturing the device according to an embodiment. FIG. 7A shows the device after the semiconductor heterostructure 100 is formed with the alternating 2DEGs 102 and 2DHGs 104 extending in parallel at different depths in the heterostructure 100 and a mask 136 is formed on the first (top) surface 101. For example, GaN/AlGaN/GaN or GaN/InAlN/GaN structures 122/124 can be epitaxially grown on an appropriate substrate 120. The first (source) and second (drain) doped regions 106, 108 are also formed e.g. by deep implantation or trench technology using n+ contacts in order to contact the 2DEG channels 102 also as shown in FIG. 7A.

Figure 7B:
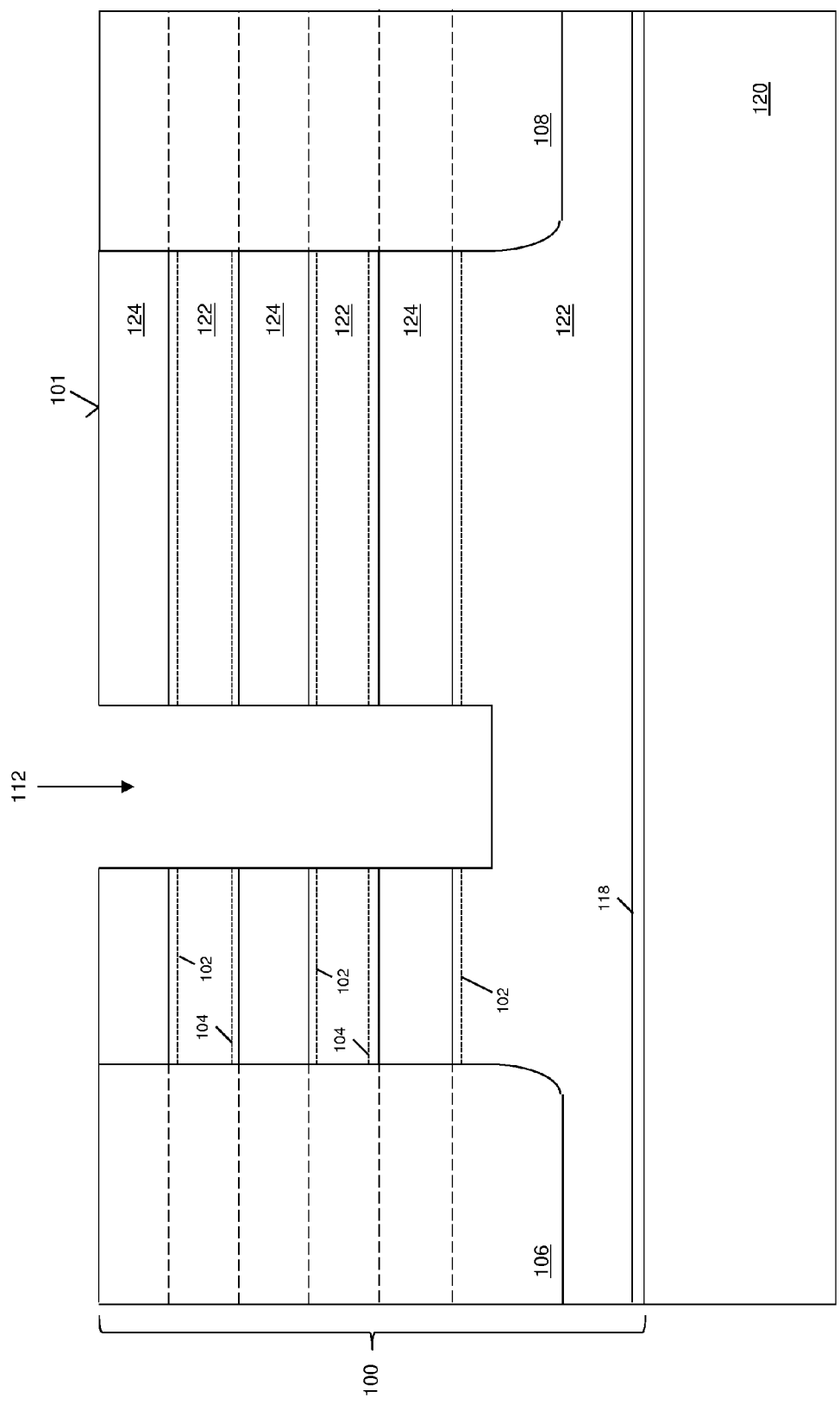

FIG. 7B shows the semiconductor device after trenches 112 are formed in the unmasked part of the heterostructure 100 between the first (source) and second (drain) doped regions 106, 108. The protected part of the heterostructure 100 is where the 2DHG contacts 126 are to be eventually formed. In FIG. 7B, the 2DHG contacts 126 are to be formed in the first (source) doped region 106 e.g. as shown in FIGS. 1 and 2. Alternatively, a part of the heterostructure 100 between the trenches 112 and the second (drain) doped region 108 can be protected for later formation of the 2DHG contacts 126 e.g. as shown in FIGS. 5 and 6. In either case, the trenches 112 extend at least to the lowest 2DEG channel 102 in this embodiment.

Figure 7C:
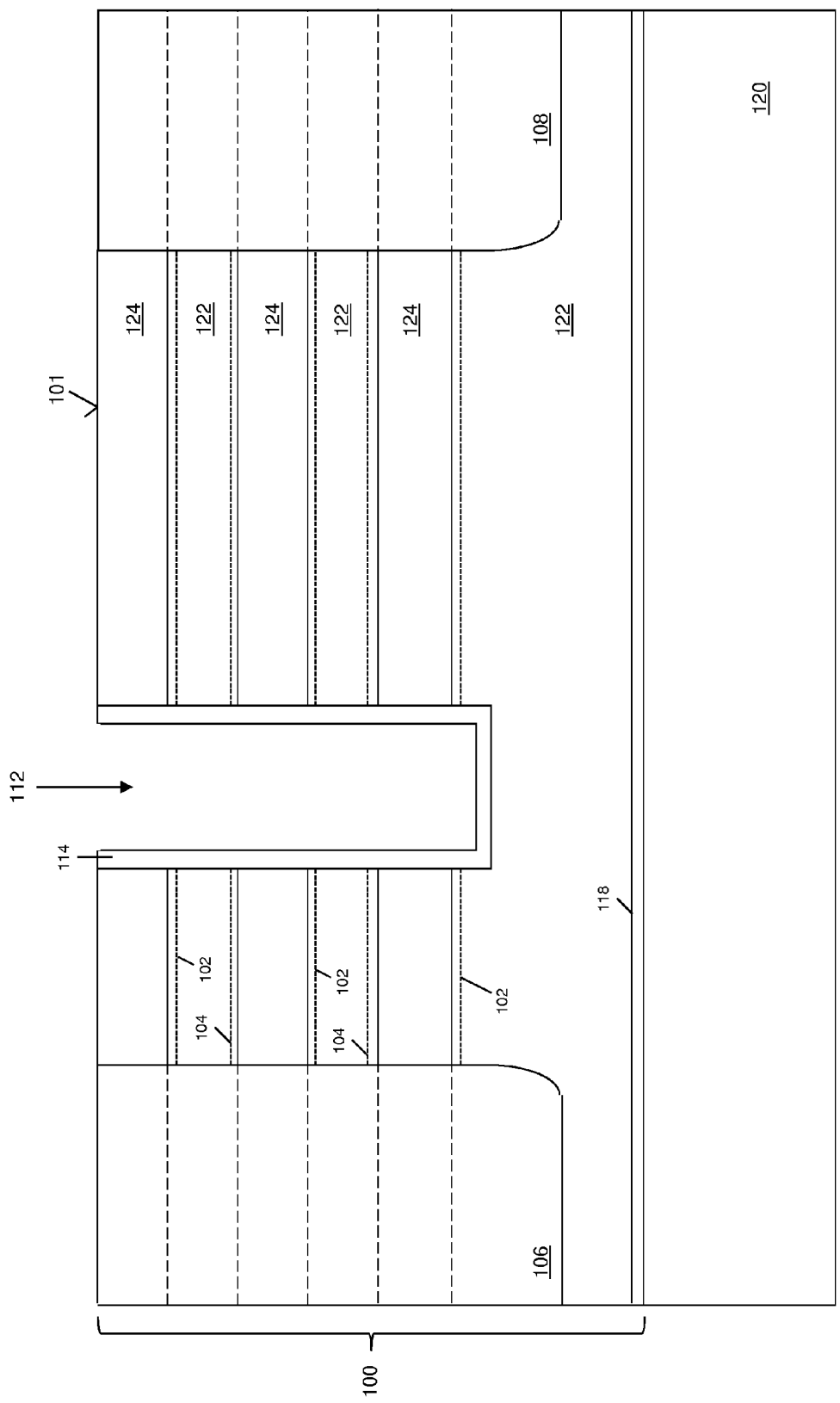

FIG. 7C shows the semiconductor device after the bottom and sidewalls of each trench 112 are covered with an insulating material 114 such as aluminum oxide, silicon oxide, hafnium oxide or silicon nitride. The insulating material 114 can be restricted to the trenches 112 after processing e.g. as shown in FIG. 3 or also extend onto and cover the first (top) surface 101 of the heterostructure 100 between adjacent trenches 112 e.g. as shown in FIG. 4. In either case, an electrically conductive material 116 such as polysilicon or a metal is formed on the insulating material 114 in the trenches 112. The electrically conductive material 116 can be restricted to the trenches 112 after processing e.g. as shown in FIG. 3 or also extend onto the first (top) surface 101 of the heterostructure 100 between adjacent trenches 112 so that adjacent trench structures 110 share the same contiguous insulating material 114 and the same contiguous electrically conductive material 116 e.g. as shown in FIG. 4.

Figure 7D:
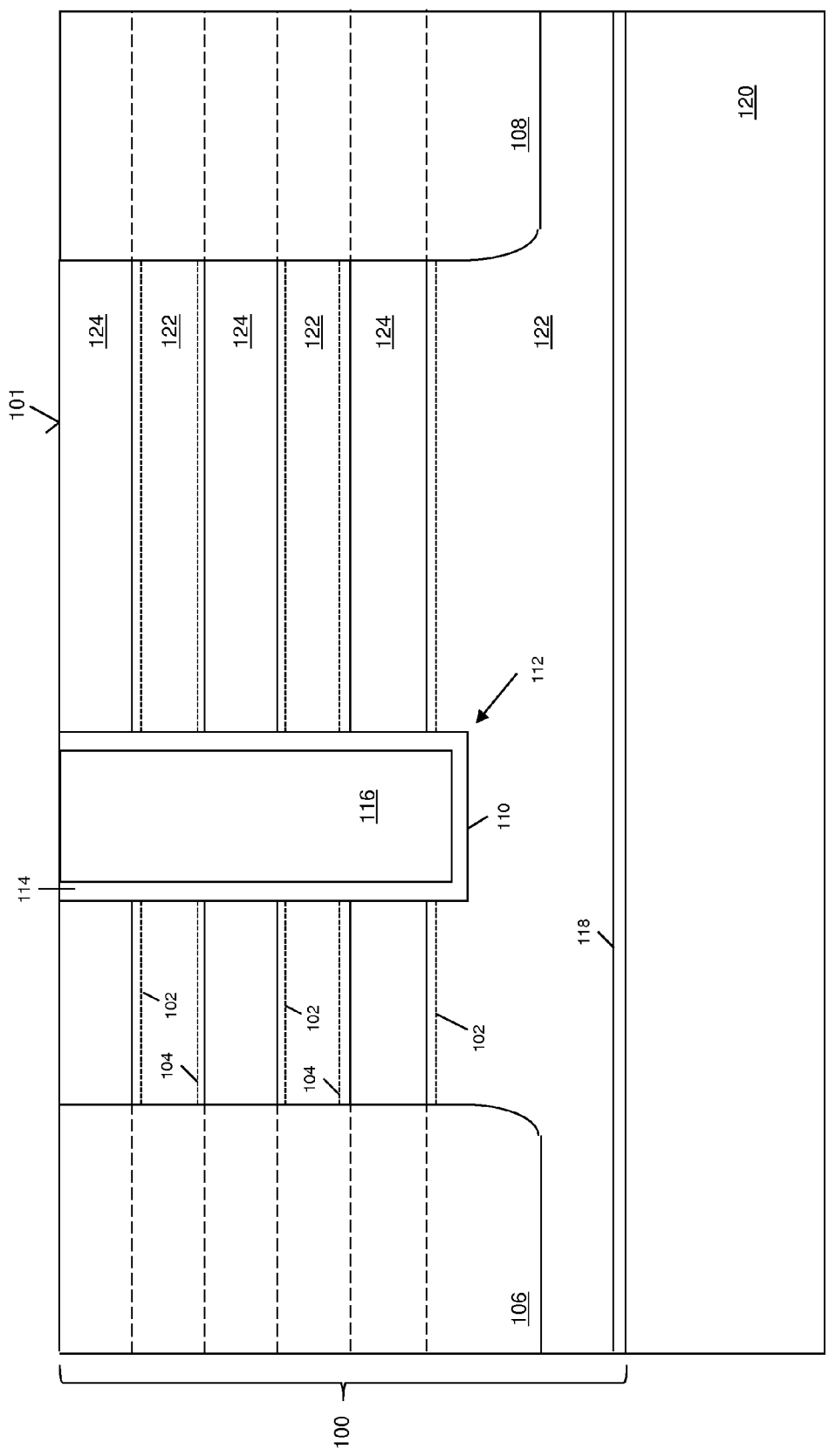

FIG. 7D shows the semiconductor device after the insulating and electrically conductive materials 114, 116 are formed in the trenches 112 and the first (top) surface 101 of the heterostructure 100 is planarized e.g. by CMP (chemical mechanical polishing) and/or etching. At this point, the trench structures 110 are formed.

Figure 7E:
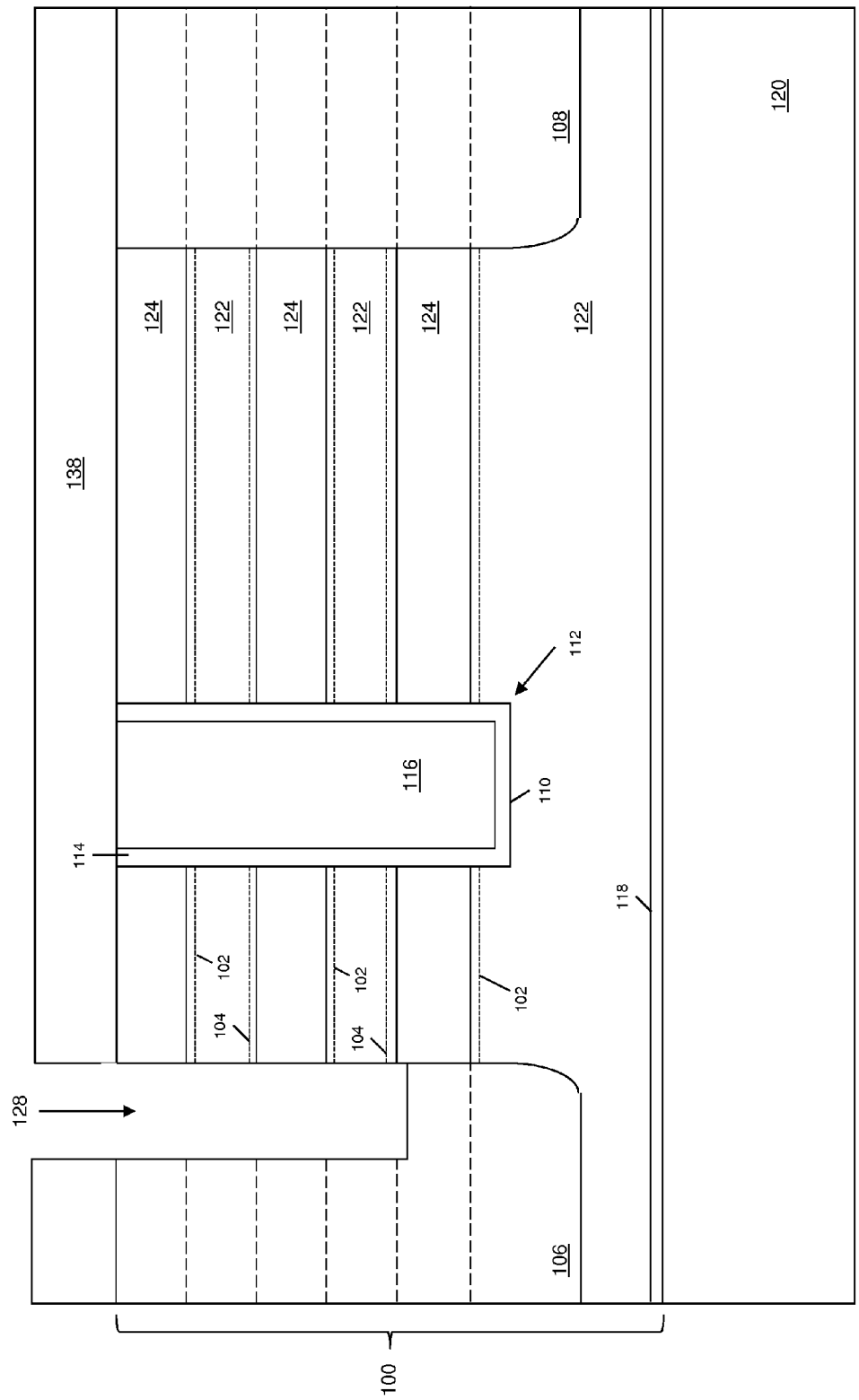

FIG. 7E shows the semiconductor device after the part of the semiconductor heterostructure 100 with the trench structures 110 is protected by a mask 138 and the part of the heterostructure 100 where the 2DHG contacts 126 are to be formed is unprotected. In this case, the unprotected part of the heterostructure 100 is over the first (source) doped region 106 of the device but instead may be between the trench structures 110 and the second (drain) doped region 108. In either case, trenches 128 are formed in the heterostructure 100 for the 2DHG contacts 126 as shown in FIG. 7E.

Figure 7F:
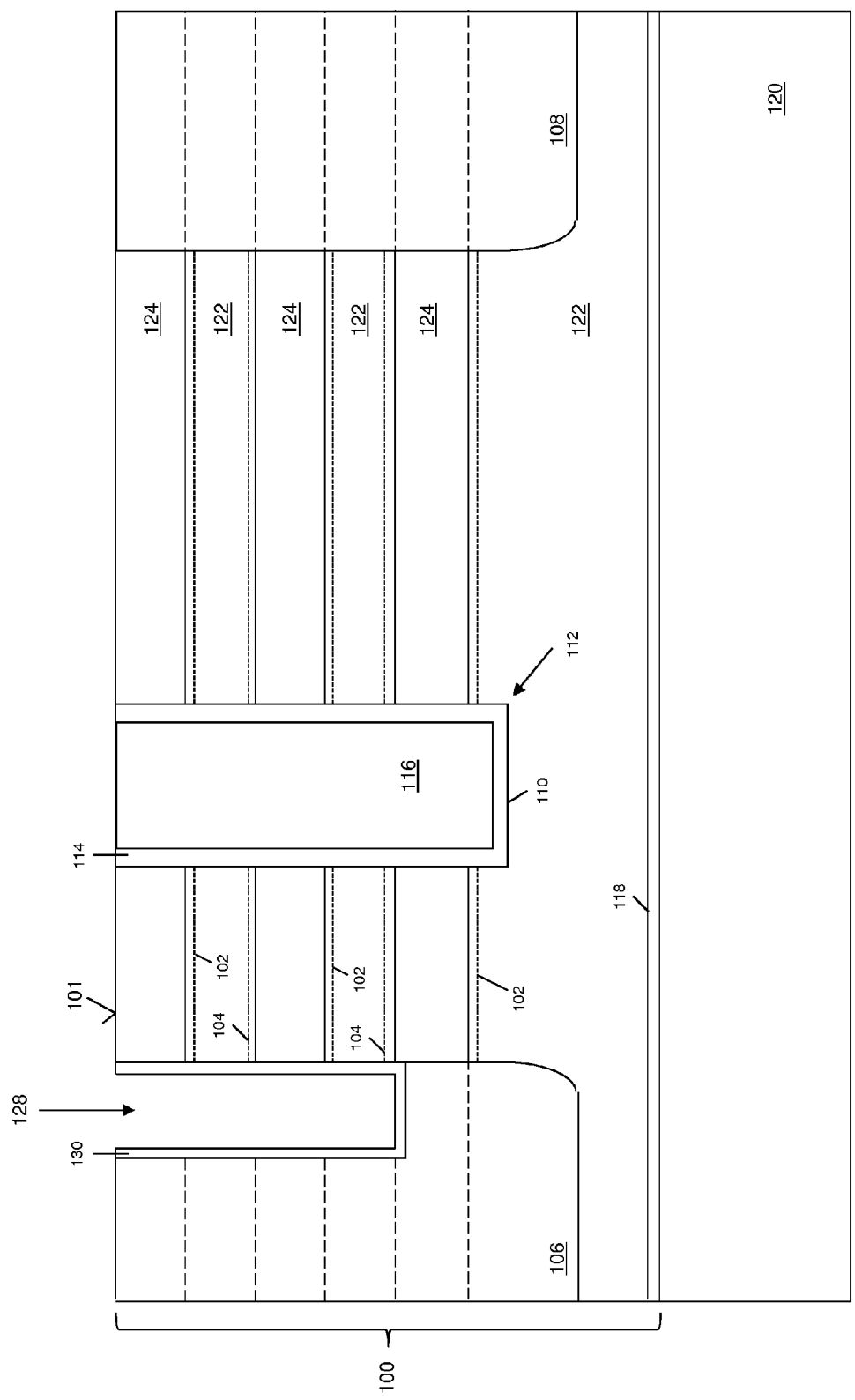

FIG. 7F shows the semiconductor device after the bottom and sidewalls of each 2DHG contact trench 128 is covered with a first metal 130 e.g. such as NiAu. This conformal metal layer 130 can be formed by any suitable conventional metal deposition process. The remainder of the 2DHG trenches 128 are then filled with a second metal 132 different than the first metal 130 e.g. such as Al or an Al alloy to complete the 2DHG contacts 126 e.g. as shown in FIG. 2. Alternatively, the 2DHG contacts 126 can be p+ doped regions disposed in the heterostructure 100. In each case, the heterostructure 100 is then planarized. Electrodes, inter-level dielectrics and metal wiring can then be formed on the planarized heterostructure 100 using any suitable conventional processing techniques. Furthermore, a parallel body diode can be implemented by taking advantage of the low-resistance multi-channel structure disclosed herein e.g. a pn-diode or by placing an additional integrated body diode below the 2DEG channels 102.

Figure 8:
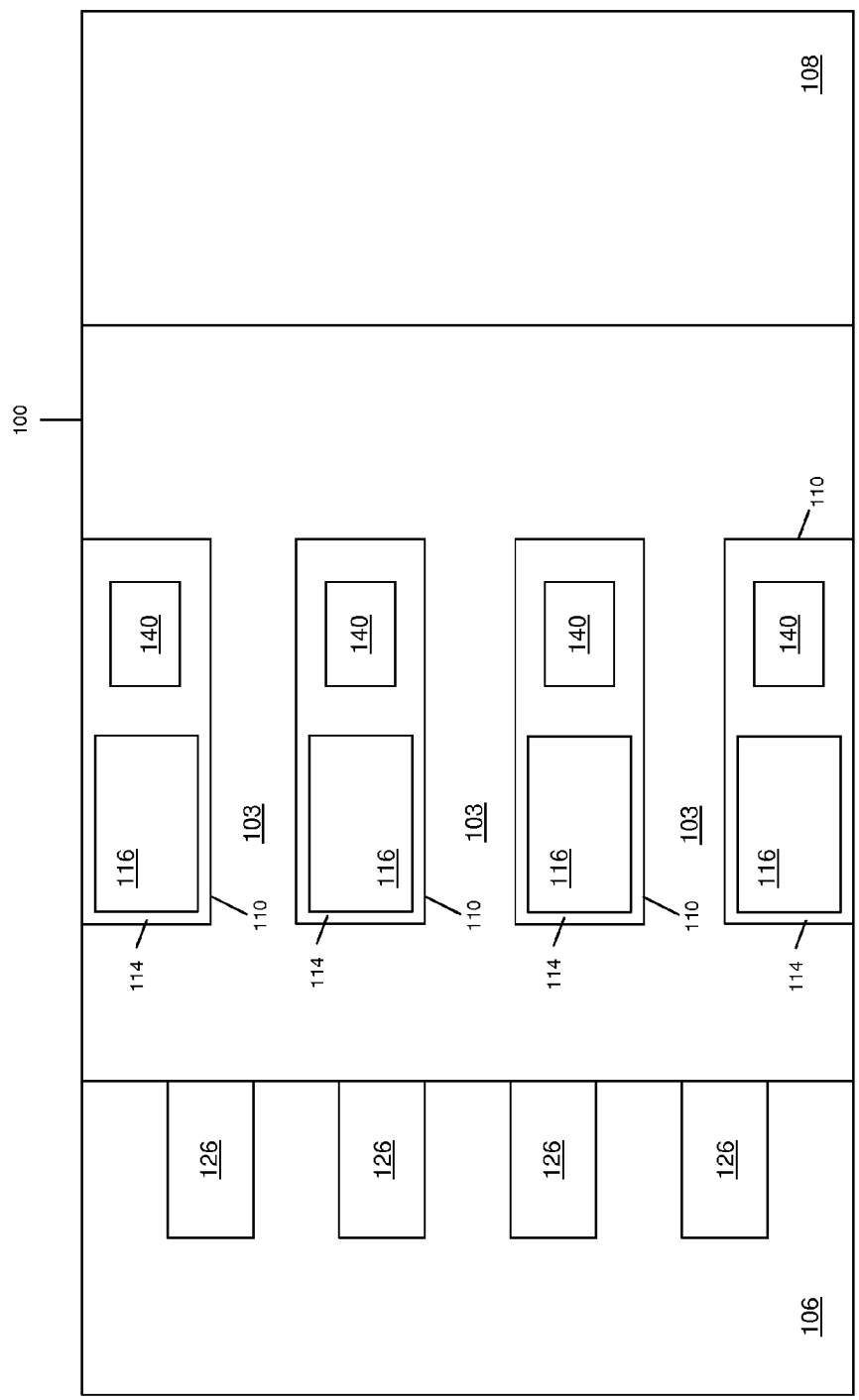
FIG. 8 illustrates a top-down plan view of a semiconductor device with a field plate according to an embodiment.
Figure 9:
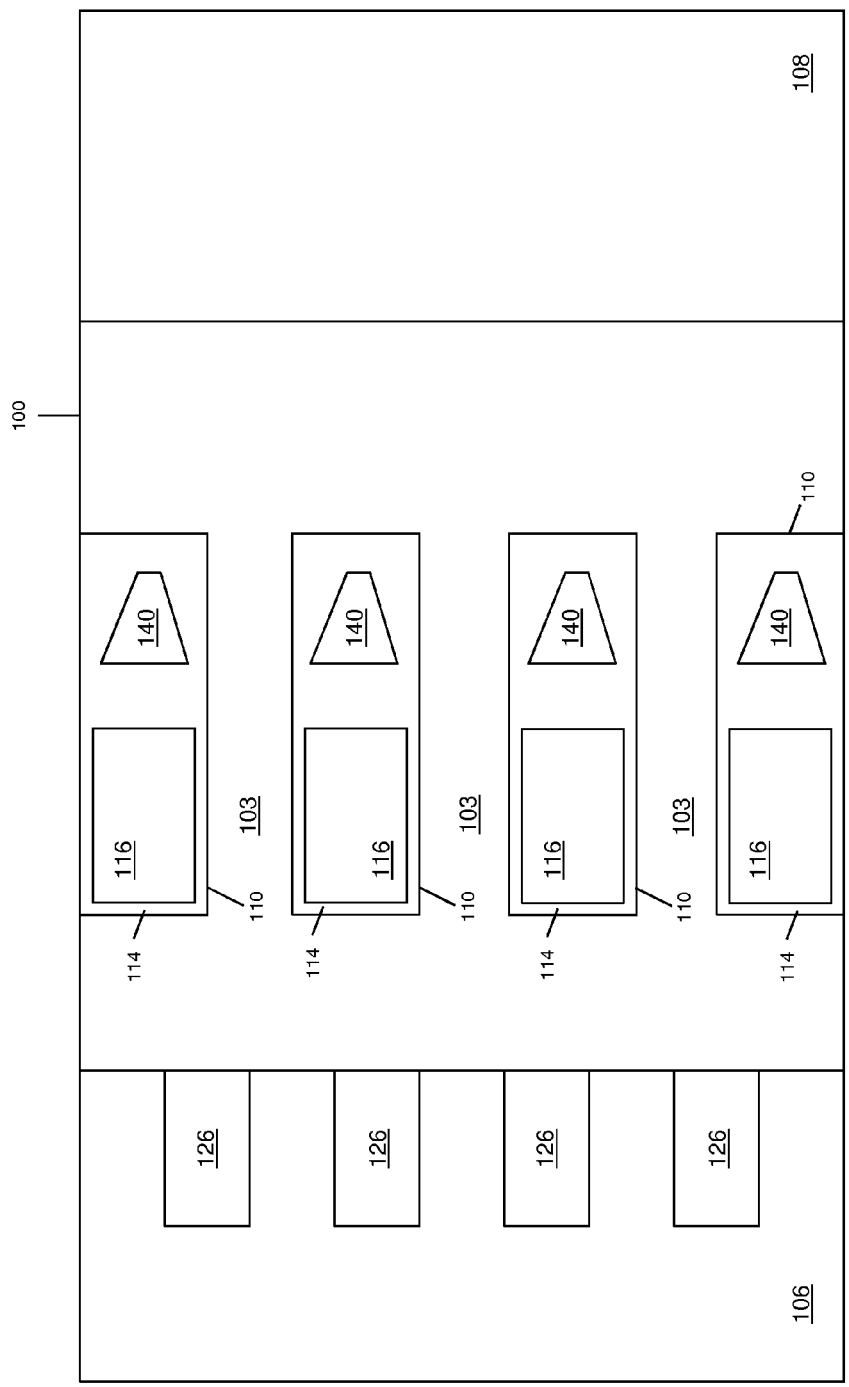
FIG. 9 illustrates a top-down plan view of a semiconductor device with a field plate according to another embodiment.

FIGS. 8 through 10 illustrate different top-down plan views of additional embodiments of a multi-channel GaN-based transistor. According to these embodiments, a field plate 140 is also provided in the trench structures 110 between the gate electrode 116 and the drain 108 of the transistor. The field plate 140 preferably extends to the same depth in the heterostructure 100 as the gate electrode 116. The field plate 140 can be electrically connected to the source 106 or the gate electrode 116. The field plate 140 can help to deplete the parallel 2DEG channels 102 formed in the heterostructure 100 and reduce the electric fields at the gate edge. The field plate 140 also reduces the gate-to-drain capacitance Cgd of the transistor and improves QGD/QGS (gate-to-drain and gate-to-source charges) if connected to the source.

In the embodiments shown in FIGS. 8 and 9, each field plate 140 is separated from the gate electrode 116 in the same trench structure 110 by the trench insulating material 114. The trench insulating material 114 can be thicker between the field plate 140 and the heterostructure 100 than between the gate electrode 116 and the heterostructure 100. The field plate 140 can have different shapes. For example, in FIG. 8 the field plates 140 have a rectangular shape and in FIG. 9 the field plates 140 have a trapezoidal shape. Still other field plate shapes may be used. The field plate 140 in FIG. 10 is formed as a contiguous integral part of the gate electrode 116, and has a stepped-down shape in a direction toward the drain 108.

The field plates 140 can be formed at the same time as the trench structures 110. For example, trenches can be etched into the heterostructure 100 and a trench insulator layer can be formed on the bottom and sidewalls of each trench e.g. as shown in FIGS. 7B and 7C. The field plates 140 shown in FIGS. 9 and 10 can be realized e.g. by defining the desired field plate shape by a lithographic mask and not by different depositions. In general, any random field plate shape can be achieved by filling a field plate trench in the heterostructure 100 with an insulating material 114 and reopening the trench using a second lithographic mask. Metal or other electrically conductive material such as polysilicon is then provided in the trenches to form the gate electrodes 116 and the field plates 140. The field plates 140 and trench structures 110 can be formed at the same or different times.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of manufacturing a transistor device, the method comprising:
    forming a semiconductor heterostructure including a plurality of alternating two-dimensional electron gasses (2DEGs) and two-dimensional hole gasses (2DHGs) extending in parallel at different depths in the semiconductor heterostructure, the 2DEGs forming current channels of the transistor device;
    forming a source extending into the semiconductor heterostructure in contact with the 2DEGs at a first end of the current channels;
    forming a drain extending into the semiconductor heterostructure in contact with the 2DEGs at an opposing second end of the current channels;
    forming a plurality of spaced apart gate structures extending into the semiconductor heterostructure and comprising an electrically conductive material separated from the surrounding semiconductor heterostructure by an insulating material;
    spacing the gate structures apart from one another in a direction perpendicular to a current flow direction of the transistor device so that current flows around and between the gate structures through regions of the semiconductor heterostructure disposed between adjacent ones of the gate structures via the 2DEG current channels when the transistor device is biased in an on-state; and
    configuring the gate structures to deplete the 2DEG current channels from sides of the gate structures in regions of the semiconductor heterostructure disposed between adjacent ones of the gate structures.

2. The method of claim 1, wherein forming the semiconductor heterostructure comprises epitaxially growing alternating layers of GaN alloy on GaN, each GaN layer interposed between underlying and overlying ones of the GaN alloy layers having a 2DEG near the interface with the overlying GaN alloy layer and a 2DHG near the interface with the underlying GaN alloy layer, and wherein the plurality of gate structures extend into the semiconductor heterostructure to the lowermost GaN layer.

3. The method of claim 1, wherein forming the plurality of gate structures comprises:
    etching trenches into the semiconductor heterostructure;
    covering sidewalls and a bottom of adjacent ones of the trenches and a surface of the semiconductor heterostructure between the adjacent trenches with the insulating material; and
    forming the electrically conductive material on the insulating material in the adjacent trenches and on the surface of the semiconductor heterostructure between the adjacent trenches so that adjacent ones of the gate structures share the same contiguous insulating material and the same contiguous electrically conductive material.

4. The method of claim 1, wherein forming the plurality of gate structures comprises:
    etching trenches into the semiconductor heterostructure;
    covering sidewalls and a bottom of each trench with the insulating material; and filling each trench with the electrically conductive material after the sidewalls and bottom of each trench are covered with the insulating material.

5. The method of claim 1, further comprising forming a plurality of spaced apart contacts extending into the semiconductor heterostructure in contact with the 2DHGs.

6. The method of claim 5, wherein forming the plurality of contacts comprises:
   etching trenches into the semiconductor heterostructure;
   covering sidewalls and a bottom of each trench with a first metal; and
   filling each trench with a second metal different than the first metal after the bottom and sidewalls of each trench are covered with the first metal.

7. The method of claim 5, comprising forming the plurality of contacts in the source.

8. The method of claim 5, comprising forming the plurality of contacts in the semiconductor heterostructure between the plurality of gate structures and the drain.

* * * * *